(12) United States Patent
Zhou et al.

(10) Patent No.: US 9,350,810 B2
(45) Date of Patent: May 24, 2016

(54) CONSTRUCTING AN INTEGRATED ROAD NETWORK

(75) Inventors: Guiheng Zhou, Beijing (CN); Yizhen Zhao, Mountain View, CA (US); Bo Zheng, Beijing (CN)

(73) Assignee: Google Inc., Mountain View, CA (US)

( * ) Notice: Subject to any disclaimer, the term of this patent is extended or adjusted under 35 U.S.C. 154(b) by 459 days.

(21) Appl. No.: 13/979,012

(22) PCT Filed: Jan. 18, 2011

(86) PCT No.: PCT/CN2011/070346
§ 371 (c)(1),
(2), (4) Date: Jul. 10, 2013

(87) PCT Pub. No.: WO2012/097499
PCT Pub. Date: Jul. 26, 2012

(65) Prior Publication Data
US 2013/0290400 A1    Oct. 31, 2013

(51) Int. Cl.
*G06G 7/48*     (2006.01)
*H04L 29/08*    (2006.01)
*G01C 21/34*    (2006.01)
*G01C 21/32*    (2006.01)
*G06F 17/50*    (2006.01)

(52) U.S. Cl.
CPC ........... *H04L 67/12* (2013.01); *G01C 21/32* (2013.01); *G01C 21/3484* (2013.01); *G06F 17/509* (2013.01)

(58) Field of Classification Search
CPC ... G01C 21/3434; G01C 21/32; G06K 9/0063
See application file for complete search history.

(56) References Cited

U.S. PATENT DOCUMENTS

| 6,622,085 | B1 * | 9/2003 | Amita ................... G01C 21/32 340/990 |
| 2007/0014488 | A1 * | 1/2007 | Chen ................... G06K 9/0063 382/294 |
| 2010/0070253 | A1 | 3/2010 | Hirata et al. |

(Continued)

FOREIGN PATENT DOCUMENTS

| CN | 101753432 A | 6/2010 |
| EP | 1024346 | 8/2000 |
| JP | 2009-211150 A | 9/2009 |

OTHER PUBLICATIONS

Patent Cooperation Treaty, International Search Report and Written Opinion, International Patent Application No. PCT/CN2011/070346, Oct. 20, 2011, 9 Pages.

*Primary Examiner* — Kandasamy Thangavelu
(74) *Attorney, Agent, or Firm* — Fenwick & West LLP

(57) ABSTRACT

Information about different road networks is retrieved from different sources. Applicable rules and parameter values for constructing an integrated road network are determined for each road network. Roads are first extended at their endpoints. Intersection points among the extended roads are detected. Roads are then divided into road segments at the detected intersection points, and shorted by removing road segments extended beyond intersection points. To process a large scale of road information, extended roads are divided into road segments and distributed to reducers based on their geographic locations for the reducers to detect intersection points among the received road segments. The resulting road segments are then distributed to reducers based on the roads they belong to for the reducers to first reassemble the road segments, then divide the reassembled roads at the detected intersection points, and finally remove road segments extended beyond intersection points.

18 Claims, 7 Drawing Sheets

(56) References Cited

U.S. PATENT DOCUMENTS

2010/0082288 A1 4/2010 Cattin et al.
2010/0250619 A1 9/2010 Hulubei
2011/0208429 A1* 8/2011 Zheng ............... G01C 21/3484
701/533

* cited by examiner

CONSTRUCTING AN INTEGRATED ROAD NETWORK

BACKGROUND

1. Field of Disclosure

The disclosure generally relates to the field of data processing, in particular to processing road information.

2. Description of the Related Art

Information about road networks is available from sources such as digital map providers and road survey information providers. The coverage of road networks provided by different sources varies in terms of geographic regions, types of roads (major roads such as highways versus minor roads such as backstreets), and scopes of information (e.g., displaying information, routing information, traffic information). A route between two locations often involves roads in different road networks. Road networks from different sources often cannot connect correctly due to errors in the provided information and thereby causing routing errors. Accordingly, what is needed is a way to correctly connect roads in different road networks.

SUMMARY

Embodiments of the present disclosure include methods (and corresponding systems and computer program products) for constructing an integrated road network for routing by connecting roads in multiple road networks.

According to one aspect, information about different road networks is retrieved from different sources. Applicable construction rules and parameter values for constructing an integrated road network are determined for each road network. Roads in the road networks are first extended at their endpoints by applying the construction rules and parameter values. Intersection points among the extended roads are detected and roads are divided into road segments at the detected intersection points. The extended roads are then shorted by removing road segments extended beyond intersection points.

According to another aspect, extended roads are divided by mapper computers into road segments and distributed to reducer computers based on the geographic locations of the road segments for the reducer computers to detect intersection points among the received road segments. The resulting road segments are then distributed by mapper computers to reducer computers based on the roads the road segments belong to for the reducer computers to first reassemble the road segments to reassembled roads, then divide the reassembled roads at the detected intersection points, and finally remove road segments extended beyond intersection points.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the disclosed subject matter.

DETAILED DESCRIPTION

The Figures (FIGS.) and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures and may indicate similar or like functionality.

Computing Environment

Figure 1:
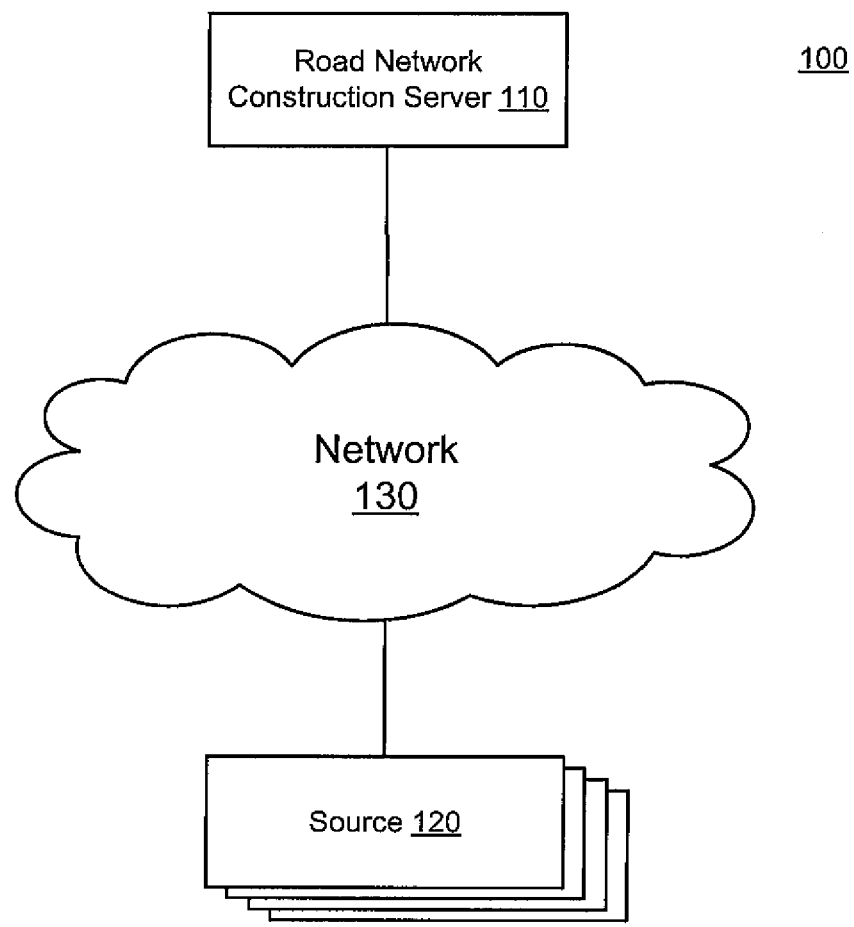
FIG. 1 is a high-level block diagram of a computing environment according to one embodiment of the present disclosure.

FIG. 1 is a high-level block diagram that illustrates a computing environment 100 suitable for constructing an integrated road network for routing by connecting roads in overlapping (or adjacent) road networks, according to one embodiment of the present disclosure. As shown, the computing environment 100 includes a road network construction server 110 and multiple road network information sources (also called "sources") 120 connected through a network 130. There can be other entities in the computing environment 100.

Figure 6A:
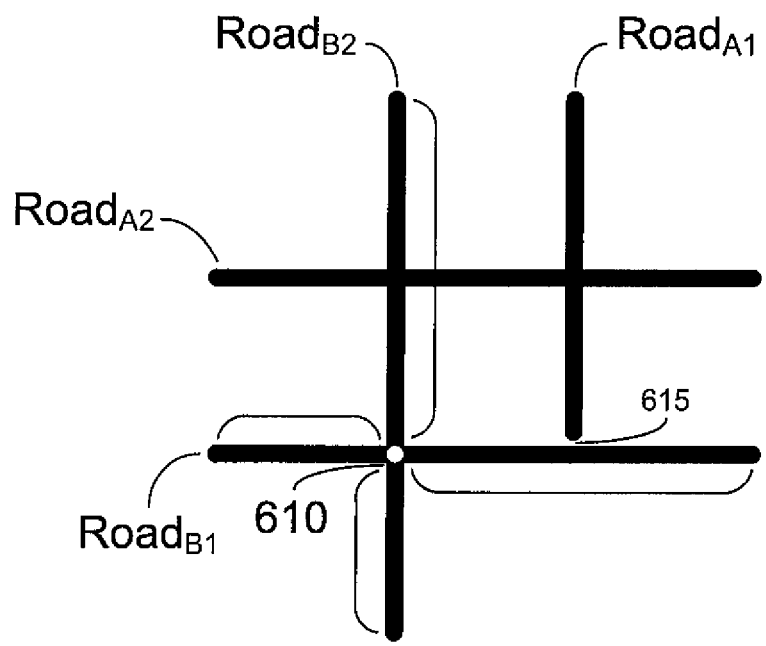
FIGS. 6A-D are diagrams illustrating a process for connecting roads in two road networks, according to one embodiment of the present disclosure.

The road network information sources 120 provide information about different road networks. A road network includes several interconnected roads, each of which includes one or more continuous road segments. For example, a road may connect with other roads and be divided into road segments at the intersection points for routing purpose by a source 120. The road segments of a road adjacent to its endpoints (i.e., the points where the road terminates) are called the end segments of that road. FIG. 6A illustrates roads in two road networks: Road Network A and Road Network B. As shown, Road Network A includes two roads denoted as $Road_{A1}$ and $Road_{A2}$, and Road Network B includes two roads denoted as $Road_{B1}$ and $Road_{B2}$. Each of $Road_{B1}$ and $Road_{B2}$ is divided into two road segments by their intersection point 610.

The information about a road network provided by a source 120 includes names, geographic locations (e.g., longitudes and latitudes of points on a road), directions, and/or lengths of roads and road segments in the road network, for example. A source 120 collects road information through road surveys and/or from sources such as governmental records and satellite images, and makes available the collected information for roads in a road network. Examples of the road network information sources 120 include digital map providers and road survey information providers.

Due to errors in the information provided by the sources 120, roads—whether in a same road network or in overlapping/adjacent road networks—that actually connect may appear disconnected within the information. For example, one or more roads of an intersection in one road network may seem to be disconnected from the other road(s) of the intersection in another road network. FIG. 6A illustrates an example of this problem, showing a gap between at a T-shape 3-way intersection (also called a "T junction") 615, between $Road_{A1}$ and $Road_{B1}$. While these roads actually intersect in the physical world, due to errors, such as survey errors, incorrect data coding, road construction or the like, the roads mistakenly appear disconnected in the provided information. In particular, because of the errors, routing and navigation systems would not create a route through this intersection point, thereby potentially resulting in an erroneous or inefficient routing solution.

The road network construction server 110 constructs an integrated road network by correcting errors in the road information and thereby connecting roads in multiple road networks provided by one or more sources 120. To correct errors in the provided road information causing connected roads to appear disconnected, the road network construction server 110 extends the roads at their endpoints to connect to nearby roads. The road network construction server 110 then divides the connected roads into road segments at their intersection points, and shortens the roads by removing end segments extended beyond the intersection points. To facilitate efficient processing of large scale road data through distributed computing, the road network construction server 110 optionally divides roads into road segments and processes road segments separately by multiple computers in parallel, using an implementation of a MapReduce, for example as described in U.S. Pat. No. 7,650,331, which is incorporated by reference herein.

The network 130 enables communications between the road network construction server 110 and the road network information sources 120. In one embodiment, the network 130 uses standard communications technologies and/or protocols. Thus, the network 130 can include links using technologies such as Ethernet, 802.11, worldwide interoperability for microwave access (WiMAX), 3G, digital subscriber line (DSL), asynchronous transfer mode (ATM), InfiniBand, PCI Express Advanced Switching, etc. Similarly, the networking protocols used on the network 130 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), etc. The data exchanged over the network 130 can be represented using technologies and/or formats including the hypertext markup language (HTML), the extensible markup language (XML), etc. In addition, all or some of links can be encrypted using conventional encryption technologies such as secure sockets layer (SSL), transport layer security (TLS), virtual private networks (VPNs), Internet Protocol security (IPsec), etc. In another embodiment, the entities can use custom and/or dedicated data communications technologies instead of, or in addition to, the ones described above. Depending upon the embodiment, the network 130 can also include links to other networks such as the Internet.

Computer Architecture

Figure 2:
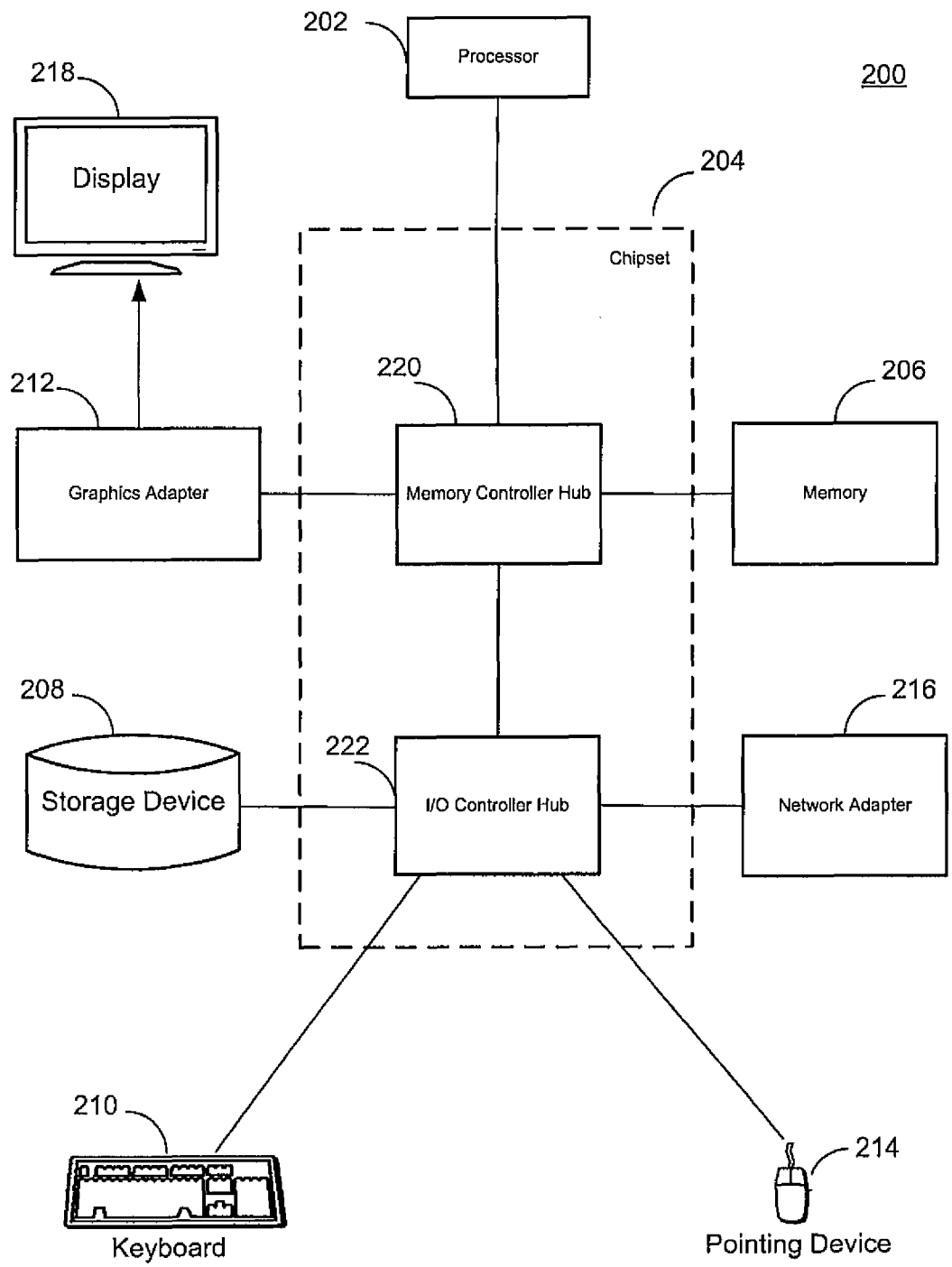
FIG. 2 is a high-level block diagram illustrating an example of a computer for use in the computing environment shown in FIG. 1 according to one embodiment of the present disclosure.

The entities shown in FIG. 1 are implemented using one or more computers. FIG. 2 is a high-level block diagram illustrating an example computer 200. The computer 200 includes at least one processor 202 coupled to a chipset 204. The chipset 204 includes a memory controller hub 220 and an input/output (I/O) controller hub 222. A memory 206 and a graphics adapter 212 are coupled to the memory controller hub 220, and a display 218 is coupled to the graphics adapter 212. A storage device 208, keyboard 210, pointing device 214, and network adapter 216 are coupled to the I/O controller hub 222. Other embodiments of the computer 200 have different architectures.

The storage device 208 is a non-transitory computer-readable storage medium such as a hard drive, compact disk read-only memory (CD-ROM), DVD, or a solid-state memory device. The memory 206 holds instructions and data used by the processor 202. The pointing device 214 is a mouse, track ball, or other type of pointing device, and is used in combination with the keyboard 210 to input data into the computer system 200. The graphics adapter 212 displays images and other information on the display 218. The network adapter 216 couples the computer system 200 to one or more computer networks.

The computer 200 is adapted to execute computer program modules for providing functionality described herein. As used herein, the term "module" refers to computer program logic used to provide the specified functionality. Thus, a module can be implemented in hardware, firmware, and/or software. In one embodiment, program modules are stored on the storage device 208, loaded into the memory 206, and executed by the processor 202.

The types of computers 200 used by the entities of FIG. 1 can vary depending upon the embodiment and the processing power required by the entity. For example, the road network construction server 110 might comprise multiple blade servers working together to provide the functionality described herein. The computers 200 can lack some of the components described above, such as keyboards 210, graphics adapters 212, and displays 218. In addition, one or more of the functions of the road network construction server 110 can also be executed in a cloud computing environment or a server farm computing environment. As used herein, cloud computing refers to a style of computing in which dynamically scalable and often virtualized resources are provided as a service over the Internet, and server farm computing refers to a style of computing in which computing resources are provided by a collection of computer servers usually maintained by an enterprise to accomplish computing needs beyond the capability of one computer.

Example Architectural Overview of the Road Network Construction Server

Figure 3:
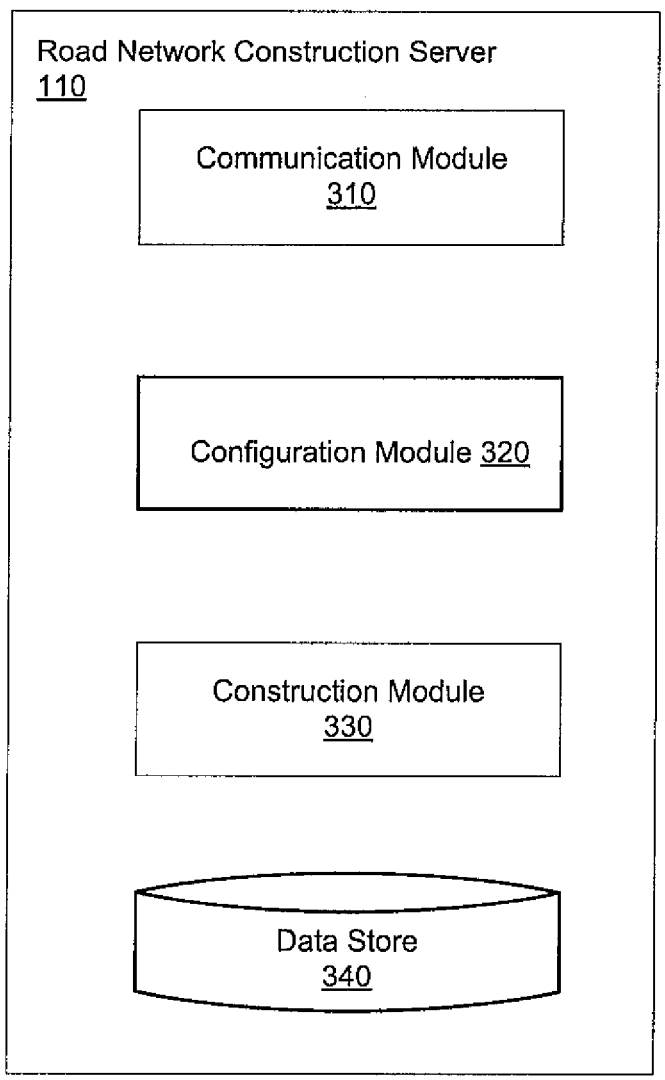
FIG. 3 is a high-level block diagram illustrating modules within a road network construction server according to one embodiment of the present disclosure.

FIG. 3 is a high-level block diagram illustrating a detailed view of modules within the road network construction server 110, according to one embodiment. Some embodiments of the road network construction server 110 have different and/or other modules than the ones described herein. Similarly, the functions can be distributed among the modules in accordance with other embodiments in a different manner than is described here. As illustrated, the road network construction server 110 includes a communication module 310, a configuration module 320, a construction module 330, and a data store 340.

The communication module 310 communicates with multiple road network information sources 120 to retrieve information about different road networks. For each road in the road networks, the communication module 310 assigns a road identifier that uniquely identifies that road, and stores the related road information together with the road identifier in the data store 340.

The configuration module 320 determines applicable construction rules and parameter values for the retrieved road networks for constructing an integrated road network. Construction rules refer to logic used to process roads in one or more road networks to form an integrated road network that can be used for routing. Example construction rules include a road extension rule, an intersection division rule, and a road shortening rule.

Figure 6B:
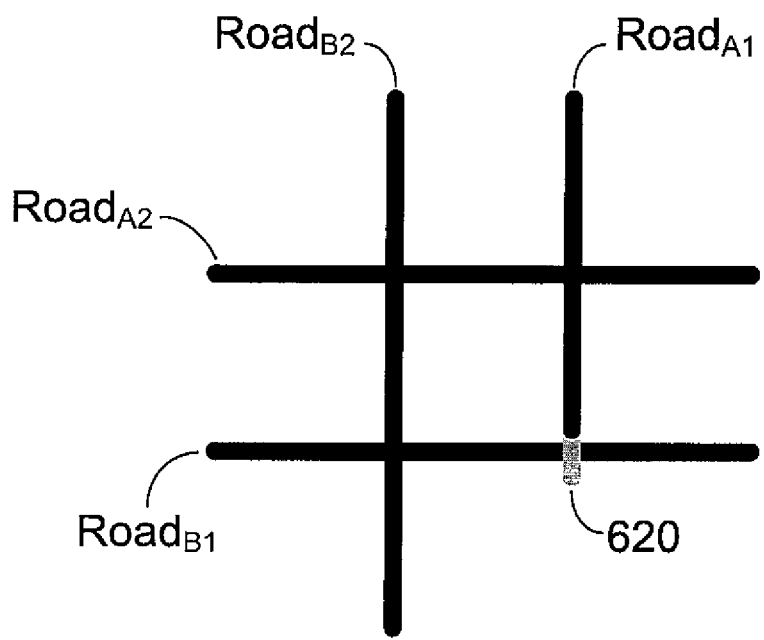

The road extension rule extends a road at its endpoints such that the road connects to nearby roads. The rule is designed to correct errors in the road information causing roads that actually connect to appear disconnected. As illustrated in FIG. 6B, $Road_{A1}$ is extended by the extension rule with extension 620, which connects $Road_{A1}$ with $Road_{B1}$.

Figure 6C:
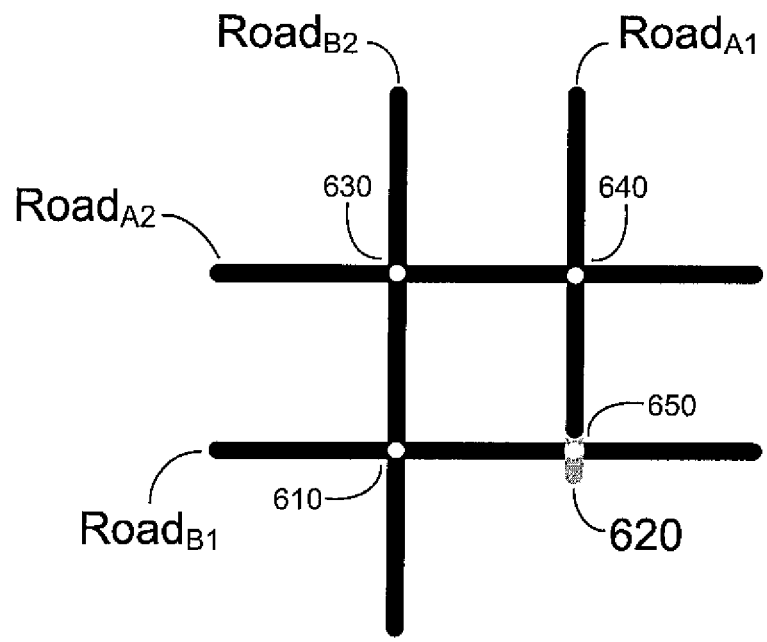

The intersection division rule divides connected roads at their intersection points. This rule is designed to facilitate routing among the intersected roads. By dividing two intersecting roads into four road segments at their intersection point, the road network construction server 110 can navigate the connected roads through the intersection point (e.g., turning left/right at the intersection point) using the resulting road segments. For purpose of description only, "A×B" refers to an intersection division rule that specifies that, if a road in the Road Network A (also called $Road_A$) intersects a road in the Road Network B (also called $Road_B$), divide $Road_A$ at the intersection point. FIG. 6C illustrates the result after applying intersection division rules A×A, A×B, and B×A to the Road Network A and Road Network B after $Road_{A1}$ is extended with extension 620, assuming $Road_{B1}$ and $Road_{B2}$ are pre-divided as illustrated in FIG. 6A. As shown, all four roads are divided into three road segments by the four intersection points after applying these intersection division rules.

Figure 6D:
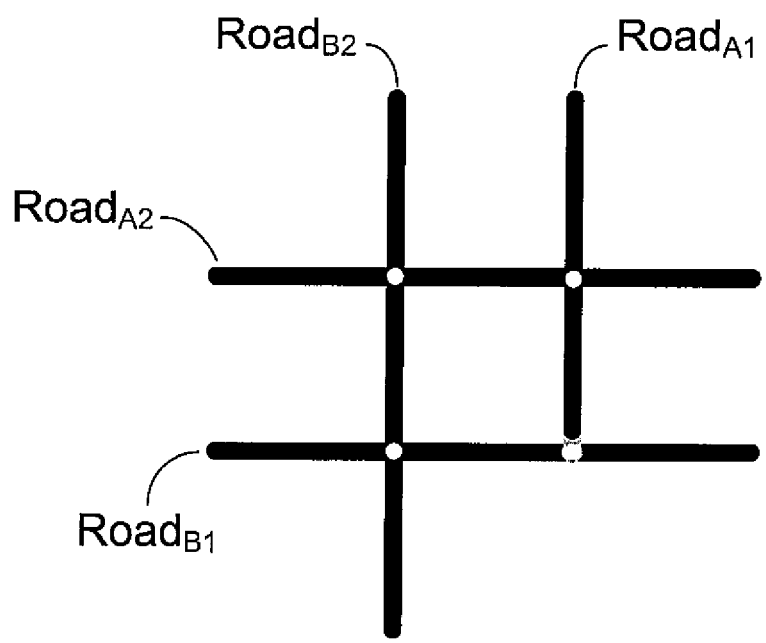

The road shortening rule shortens a road at its endpoints by removing any short end segment extended beyond an intersection point. The rule is designed to prevent the road extension rule from over-extending roads more than necessary. As illustrated in FIG. 6D, by removing the short end segment created by applying the road extension rule beyond the intersection point, $Road_{A1}$ connects to $Road_{B1}$ and terminates at the intersection point, forming a proper T-junction.

Parameters refer to values used to adjust roads according to the construction rules. Example parameters include: an extend-segment parameter that specifies how long to extend a road at its endpoints according to the road extension rule, and an shorten-segment parameter that specifies the threshold length of end segments to remove according to the road shortening rule. Parameters can be expressed in physical units (e.g., meters, feet), percentages, or normalized values.

The configuration module 320 determines the applicable construction rules and parameter values for each road network based on information about roads in the road network and/or user input. For example, if information about a road network includes routing information, then the configuration module 320 determines the values of the extend-segment parameter and the shorten-segment parameter for that road network both to be zero (i.e., no extending or shortening), and that the intersection division rule is not applicable to roads that connect within that road network.

The construction module 330 constructs an integrated road network by applying construction rules to roads in the road networks provided by the road network information source 120. The construction module 330 first applies the road extension rule to extend the roads by the applicable value(s) of the extend-segment parameter. The construction module 330 then applies the intersection division rule (where applicable) to divide the roads into road segments at intersection points, and applies the road shortening rule to remove end segments shorter than the applicable value(s) of the shorten-segment parameter. The construction module 330 stores the resulting road information as the integrated road network in the data store 340.

The data store 340 stores data used by the road network construction server 110. Examples of such data include information about the integrated road network, information about the retrieved road networks, and the construction rules and parameter values applicable for each road network, to name a few. The data store 340 may be a relational database or any other type of database.

Overview of Methodology for the Road Network Construction Server

Figure 4:
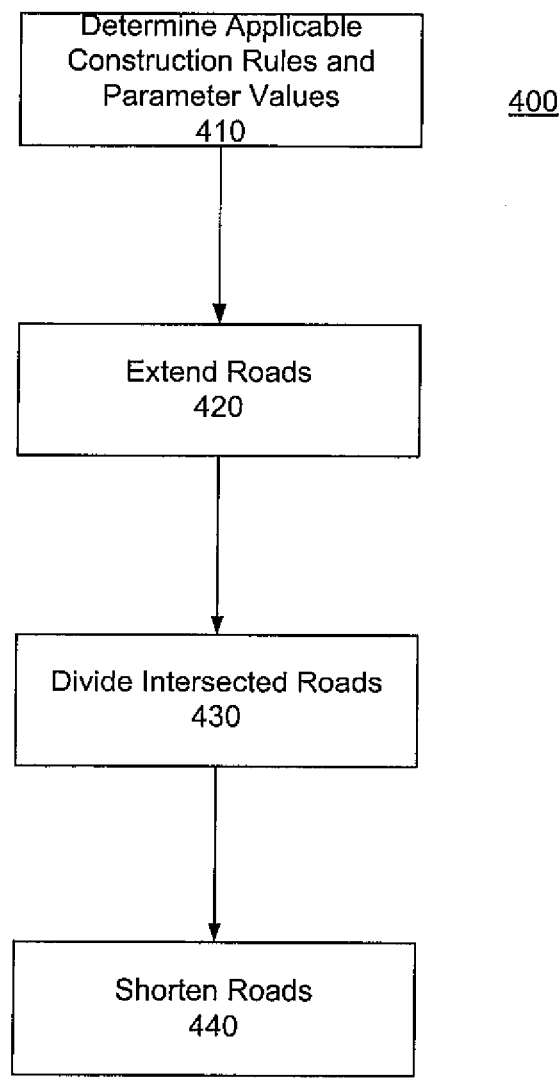
FIG. 4 is a flow diagram illustrating a process for constructing an integrated road network, according to one embodiment of the present disclosure.

FIG. 4 is a flow diagram illustrating a process 400 for the road network construction server 110 to construct an integrated road network for routing by connecting roads in multiple road networks, according to one embodiment. Other embodiments can perform the steps of the process 400 in different orders. Moreover, other embodiments can include different and/or additional steps than the ones described herein.

The road network construction server 110 determines 410 the applicable construction rules and parameter values for the road networks based on available road information and user input. The applicable construction rules and parameter values for a given road network may be specified by a human operator in a system configuration (e.g., stored in the data store 340). The road network construction server 110 determines 410 the construction rules and parameter values specified in the system configuration as the applicable construction rules and parameter values for that road network. Alternatively or additionally, the human operator may specify conditions regarding when a particular construction rule or parameter value becomes applicable (e.g., in the system configuration). The road network construction server 110 determines 410 the applicable construction rules and parameter values for a road network based on whether the conditions are satisfied by the available road information for that road network. In addition, if duplicating information about a road is presented in multiple road networks, the road network construction server 110 selects one such road network (e.g., the road network with more road information such as routing information) and uses the road information in that road network.

The road network construction server 110 applies the road extension rule to all roads in the road networks to extend 420 the roads by the applicable value of the extend-segment parameter. For example, if the applicable parameter value for a road network is 30 feet, then the road network construction server 110 extends roads in that road network from their terminal points by 30 feet in the compass directions of the roads up to the terminal points. If the applicable parameter value for a road network is zero, then the road network construction server 110 keeps roads in that road network unchanged. In one embodiment, a human operator may override the road extension rule for certain roads (e.g., where a road actually terminates near another road in physical life without crossing) by setting up exceptions for specific roads, causing the road network construction server 110 not to apply the road extension rule (or setting the parameter value to be zero) to those roads.

The road network construction server 110 detects intersections among the roads in the road networks, and applies the intersection division rule (where applicable) to divide 430 the intersecting roads at the intersection points to facilitate routing at the intersection points. The road network construction server 110 may apply algorithms such as point tracking algorithms, geometry algorithms, or other intersection detection algorithms to detect intersections among the roads in the road networks.

The road network construction server 110 applies the road shortening rule to all roads in the road networks to remove 440 any end segments shorter than the applicable value of the shorten-segment parameter. For example, if the applicable parameter value for a road network is 30 feet, the road network construction server 110 determines whether any end segment in the road network is shorter than 30 feet, and if so removes 440 such end segments from the road network. If the applicable parameter value for a road network is zero, then the road network construction server 110 keeps roads in that road network unchanged. The resulting interconnected road segments are stored as an integrated road network that can be used for routing.

One example of process 400 is illustrated using the overlapping Road Network A and Road Network B shown in FIG. 6A. Assume Road Network 13 contains routing information for roads included therein (i.e., $Road_{B1}$ and $Road_{B2}$), and Road Network A only contains display information for roads included therein (i.e., $Road_{A1}$ and $Road_{A2}$). Because routing information can be used for road navigation while displaying information, as its name indicates, is used for display purpose, the routing information is subject to a higher accuracy standard than the displaying information and thus more reliable. Accordingly, the road network construction server 110 considers the information about Road Network B more reliable than the information about Road Network A, and determines 410 the values of the extend-segment parameter and the shorten-segment parameter for Road Network B both to be zero (i.e., no extending or shortening), and the parameter values for Road Network A both to be 30 feet. In addition, the road network construction server 110 determines 410 that the intersection division rule is only applicable to road intersections between a $Road_A$ and a $Road_B$ or between two $Road_A$ (i.e., A×B, B×A, A×A), and not to road intersections between two $Road_B$ (because roads in the Road Network B are pre-divided (e.g., at the intersection point 610 by the road network information source 120)).

The road network construction server 110 extends 420 roads in Road Network A from their endpoints by 30 feet (as specified by the applicable value of the extend-segment parameter), and keeps roads in Road Network B unchanged (because the applicable value of the extend-segment parameter is zero). This is illustrated in FIG. 6B where extension 620 for $Road_{A1}$ near $Road_{B1}$ is shown.

The road network construction server 110 divides 430 the roads at the intersection points 630, 640, and 650, and shortens roads in Road Network A by dropping end segments shorter than 30 feet, such as the extension 620 of $Road_{A1}$ extended beyond the intersection point 650. The resulting integrated road network shown in FIG. 6D can be readily used for routing.

Example Implementation Using Distributed Computing

Figure 5:
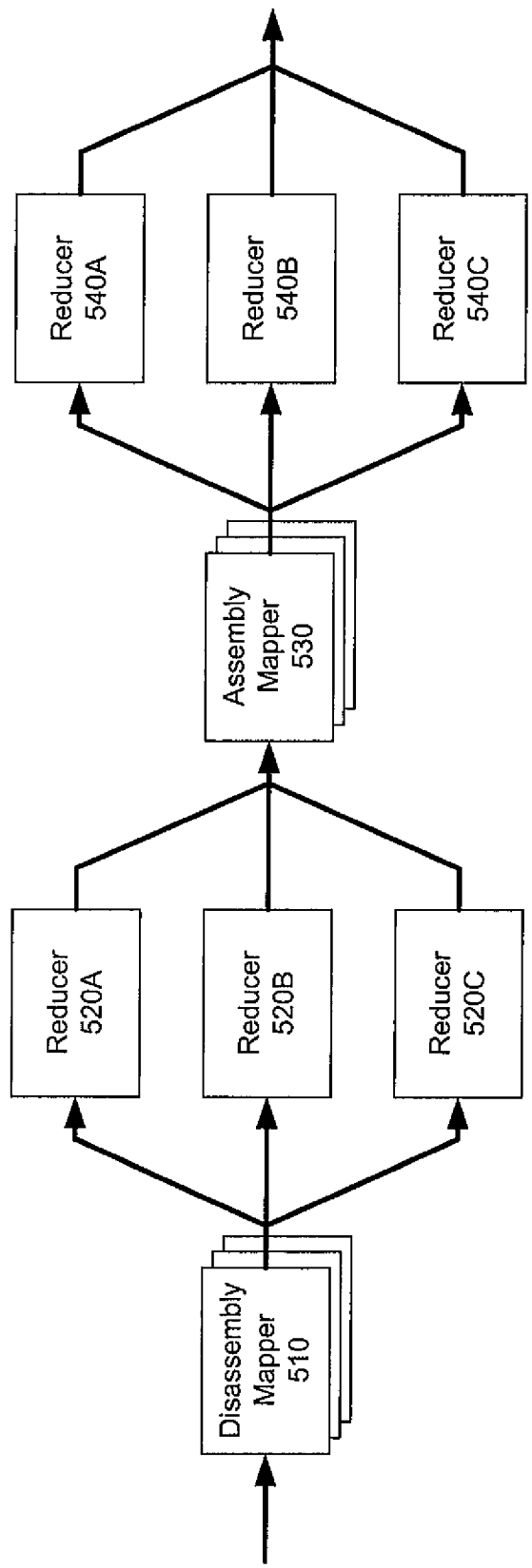
FIG. 5 is a flow diagram illustrating an implementation of the process shown in FIG. 4 using distributed computing, according to one embodiment of the present disclosure.

FIG. 5 is a flow diagram illustrating a process 500 for the road network construction server 110 to implement the process 400 using a distributed computing implementation, e.g., MapReduce, according to one embodiment. In order to process collections of road information that are too large for a single computer, the road network construction server 110 divides the road information into small portions and processes the small portions separately using multiple computers in parallel. The computers dividing the road information are called mappers. The computers processing the divided portions of information are called reducers. A mapper generates a series of key-value pairs based on its input and distributes the key-value pairs to reducers based on the keys of the key-value pairs. A reducer is associated with one or more keys and receives all key-value pairs bearing the associated keys from one or more mappers.

As shown, the road network construction server 110 implements the process 400 by controlling two sets of mappers and reducers, the first set for extending the roads and detecting intersection points, and the second set for dividing the roads at the intersection points and shortening the roads.

Mappers in the first set, hereinafter called the disassemble mappers 510, retrieve information about road networks, and extend roads in the road networks by applying the road extension rule. A road may be too long for its information to be processed by a single reducer. Thus, the disassemble mappers 510 divide roads into road segments (e.g., with equal or similar lengths) for multiple reducers to process. For example, if a road is approximately 10,000 feet long, then a disassemble mapper 510 may divide the road into 100 road segments each of which is approximately 100 feet long.

For each road segment of a road, the disassemble mapper 510 determines one or more geography grids the road segment falls into, generates a key-value pair for each of such geographic grids with the key identifying the geography grid and the value containing information related to the road segment, and distributes the key-value pairs to reducers in the first set, hereinafter called the intersection detection reducers 520, based on the keys. Geographic grids are blocks separated by vertical lines, which come together at each pole (i.e., North Pole, South Pole), and parallel horizontal lines. Each geographic grid is uniquely identified by an identifier (also called a "grid identifier"), which is used by the disassemble mapper 510 as keys to key-value pairs for road segments falling in that geographic grid. One skilled in the art would understand that the disassemble mappers 510 can divide roads based on characteristics other than the geographic grids.

The intersection detection reducers 520 are associated with grid identifiers and receive key-value pairs for road segments falling into geographic grids of the associated grid identifiers. The intersection detection reducers 520 detects road segments that intersect (or connect) inside the grids (e.g., by applying intersection detection algorithms to the road information in the value portions of the key-value pairs), and stores the detected intersection points (e.g., along with the key-value pairs) in an intermediate storage (e.g., in the data store 340).

Mappers in the second set, hereinafter called the assemble mappers 530, retrieve the information stored in the intermediate storage, change the keys of the key-value pairs from the grid identifiers to the road identifiers of the roads containing the road segments, and distribute the resulting key-value pairs to reducers in the second set, hereinafter called the assembly reducers 540, based on the new keys.

The assembly reducers 540 are associated with road identifiers and receive key-value pairs for road segments of roads identified by the associated road identifiers. The assembly reducers 540 assemble road segments that belong to a same road back together as an individual road (i.e., roll back the disassembling performed by the disassemble mapper 510), and divide the resulting roads according to the applicable intersection division rule at the detected intersection points. The assembly reducers 540 finally shorten the roads by applying the road shortening rule, and store the resulting road segments as the integrated road network (e.g., in the data store 340).

Some portions of above description describe the embodiments in terms of algorithmic processes or operations. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a system and a process for constructing an integrated road network for routing by connecting roads in multiple road networks. Thus, while particular embodiments and applications have been illustrated and described, it is to be understood that the present invention is not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A computer-implemented method for constructing an integrated road network by connecting roads in a plurality of road networks within road information, comprising:
    extending roads in a first road network among the plurality of road networks;
    dividing, by at least one computer, the extended roads in the first road network into road segments at intersection points where the extended roads connect to roads in the plurality of road networks; and
    shortening the extended roads in the first road network by removing road segments extended beyond intersection points.

2. The method of claim 1, further comprising:
    determining a first value for extending the roads in the first road network and a second value for shortening the roads in the first road network based on information available for the roads in the first road network,
    wherein extending the roads in the first road network comprises extending the roads by the first value at endpoints of the roads, and
    wherein shortening the extended roads in the first road network comprises removing road segments adjacent to the endpoints that are shorter than the second value.

3. The method of claim 1, further comprising:
    dividing, by a mapper computer, a first extended road into a plurality of road segments;
    distributing, by the mapper computer, the plurality of road segments of the first extended road to a plurality of reducer computers; and
    detecting, by one or more of the plurality of reducer computers, intersection points in the road segments of the first extended road received from the mapper computer,
    wherein shortening the roads in the first road network comprises removing road segments extended beyond the intersection points detected by the one or more reducer computers.

4. The method of claim 3, further comprising:
    determining, by the mapper computer, one or more geographic grids associated with one of the road segments of the first extended road,
    wherein distributing the plurality of road segments comprises distributing said road segment to reducer computers associated with the one or more geographic grids.

5. The method of claim 3, further comprising:
    transmitting, by one or more second mapper computers, the road segments of the first extended road along with detected intersection points to a second reducer computer;
    reassembling, by the second reducer computer, the extended road from the road segments received from the one or more mapper computers; and
    dividing, by the second reducer computer, the reassembled road into road segments at the detected intersection points.

6. The method of claim 5, further comprising:
    determining, by the one or more second mapper computers, the extended road associated with said road segments,
    wherein transmitting said road segments comprises transmitting said road segments to a reducer computer associated with the extended road.

7. A computer system for constructing an integrated road network by connecting roads in a plurality of road networks within road information, comprising:
    a non-transitory computer-readable storage medium comprising executable computer program code for:
        extending roads in a first road network among the plurality of road networks;
        dividing the extended roads in the first road network into road segments at intersection points where the extended roads connect to roads in the plurality of road networks; and shortening the extended roads in the first road network by removing road segments extended beyond intersection points.

8. The computer system of claim 7, wherein the non-transitory computer-readable storage medium further comprises executable computer program code for:
determining a first value for extending the roads in the first road network and a second value for shortening the roads in the first road network based on information available for the roads in the first road network,
wherein extending the roads in the first road network comprises extending the roads by the first value at endpoints of the roads, and
wherein shortening the extended roads in the first road network comprises removing road segments adjacent to the endpoints that are shorter than the second value.

9. The computer system of claim 7, wherein the non-transitory computer-readable storage medium further comprises executable computer program code for:
dividing, by a mapper computer, a first extended road into a plurality of road segments;
distributing, by the mapper computer, the plurality of road segments of the first extended road to a plurality of reducer computers; and
detecting, by one or more of the plurality of reducer computers, intersection points in the road segments of the first extended road received from the mapper computer,
wherein shortening the roads in the first road network comprises removing road segments extended beyond the intersection points detected by the one or more reducer computers.

10. The computer system of claim 9, wherein the non-transitory computer-readable storage medium further comprises executable computer program code for:
determining, by the mapper computer, one or more geographic grids associated with one of the road segments of the first extended road,
wherein distributing the plurality of road segments comprises distributing said road segment to reducer computers associated with the one or more geographic grids.

11. The computer system of claim 9, wherein the non-transitory computer-readable storage medium further comprises executable computer program code for:
transmitting, by one or more second mapper computers, the road segments of the first extended road along with detected intersection points to a second reducer computer;
reassembling, by the second reducer computer, the extended road from the road segments received from the one or more mapper computers; and
dividing, by the second reducer computer, the reassembled road into road segments at the detected intersection points.

12. The computer system of claim 11, wherein the non-transitory computer-readable storage medium further comprises executable computer program code for:
determining, by the one or more second mapper computers, the extended road associated with said road segments,
wherein transmitting said road segments comprises transmitting said road segments to a reducer computer associated with the extended road.

13. A non-transitory computer-readable storage medium storing executable computer program instructions for constructing an integrated road network by connecting roads in a plurality of road networks within road information, the computer program instructions comprising instructions for:
extending roads in a first road network among the plurality of road networks;
dividing the extended roads in the first road network into road segments at intersection points where the extended roads connect to roads in the plurality of road networks; and
shortening the extended roads in the first road network by removing road segments extended beyond intersection points.

14. The storage medium of claim 13, wherein the computer program instructions further comprise:
determining a first value for extending the roads in the first road network and a second value for shortening the roads in the first road network based on information available for the roads in the first road network,
wherein extending the roads in the first road network comprises extending the roads by the first value at endpoints of the roads, and
wherein shortening the extended roads in the first road network comprises removing road segments adjacent to the endpoints that are shorter than the second value.

15. The storage medium of claim 13, wherein the computer program instructions further comprise:
dividing, by a mapper computer, a first extended road into a plurality of road segments;
distributing, by the mapper computer, the plurality of road segments of the first extended road to a plurality of reducer computers; and
detecting, by one or more of the plurality of reducer computers, intersection points in the road segments of the first extended road received from the mapper computer,
wherein shortening the roads in the first road network comprises removing road segments extended beyond the intersection points detected by the one or more reducer computers.

16. The storage medium of claim 15, wherein the computer program instructions further comprise:
determining, by the mapper computer, one or more geographic grids associated with one of the road segments of the first extended road,
wherein distributing the plurality of road segments comprises distributing said road segment to reducer computers associated with the one or more geographic grids.

17. The storage medium of claim 15, wherein the computer program instructions further comprise:
transmitting, by one or more second mapper computers, the road segments of the first extended road along with detected intersection points to a second reducer computer;
reassembling, by the second reducer computer, the extended road from the road segments received from the one or more mapper computers; and
dividing, by the second reducer computer, the reassembled road into road segments at the detected intersection points.

18. The storage medium of claim 17, wherein the computer program instructions further comprise:
determining, by the one or more second mapper computers, the extended road associated with said road segments,
wherein transmitting said road segments comprises transmitting said road segments to a reducer computer associated with the extended road.

* * * * *